United States Patent [19]

Baccarani et al.

[11] Patent Number: 4,752,704

[45] Date of Patent: Jun. 21, 1988

[54] NOISE SUPPRESSION INTERFACE CIRCUIT FOR NON-SUPERIMPOSED TWO-PHASE TIMING SIGNAL GENERATOR

[75] Inventors: Giorgio Baccarani, Modena; Carlo Dallavalle, Vimercate, both of Italy

[73] Assignee: SGS-ATES Componentic Elettronici S.p.A., Agrate Brianza, Italy

[21] Appl. No.: 717,391

[22] Filed: Mar. 29, 1985

[30] Foreign Application Priority Data

Mar. 30, 1984 [IT] Italy ................................ 20337 A/84

[51] Int. Cl.$^4$ .................. H03K 3/013; H03K 19/017; H03K 19/003
[52] U.S. Cl. ..................................... 307/573; 307/575; 307/576; 307/577; 307/568; 307/544; 307/579; 307/296 R
[58] Field of Search ............... 307/572, 573, 575, 576, 307/567, 568, 557, 560, 544, 542, 550, 577, 582, 497, 202 A, 296 R, 582, 579

[56] References Cited

U.S. PATENT DOCUMENTS 4,477,736 10/1984 Onishi ................................ 307/297
4,518,873  5/1985 Suzuki et al. ...................... 307/451
4,527,077  7/1985 Higuchi et al. .................... 307/443

Primary Examiner—Stanley D. Miller
Assistant Examiner—Richard Roseen
Attorney, Agent, or Firm—Harry M. Weiss; Victor Flores

[57] ABSTRACT

A noise suppression interface circuit, using field effect transistors of MOS type, for non-superimposed two-phase timing signal generators is described. The upper level and the lower level of the output timing signals are determined by the potentials of two circuit nodes ($V_H$, $V_L$) which are respectively coupled, by a first transistor (M1) and a second transistor (M2), operating at saturation, to a first supply terminal ($+V_{DD}$) and a second supply terminal ($-V_{SS}$) having potentials which are respectively equal and opposite to a common potential. The circuit nodes ($V_H$, $V_L$) are both coupled to the common potential by identical number of transistors (M3, M4; M5, M6) each coupled in a diode configuration.

13 Claims, 1 Drawing Sheet

NOISE SUPPRESSION INTERFACE CIRCUIT FOR NON-SUPERIMPOSED TWO-PHASE TIMING SIGNAL GENERATOR

BACKGROUND OF THE INVENTION

1. Field of the Invention

The present invention relates generally to interface circuits for non-superimposed two-phase timing signal generators, having a pulse waveform of rectangular type and, more particularly, to an interface circuit, using insulated-gate field-effect transistors of the MOS (Metal Oxide Semiconductor) type, designed to suppress the noise caused by fluctuations of the supply voltage in these timing signals and to supply, in this way, low-noise timing signals. The low-noise timing signals can be used to drive the circuits of devices in which low sensitivity to supply voltage variations is an important factor.

2. Discussion of the Related Art

The effect which supply voltage variations have on the output of the circuit being supplied, generally known in the prior art as "power-supply rejection ratio" (PSRR) has become an increasingly important design parameter, particularly in the case of recent circuit structures in which analog and digital sub-systems are used together in an integrated circuit.

In this case it is, in practice, almost impossible to prevent the noise caused in one sub-system by supply voltage variations from introducing noise into the other sub-system.

In this respect, it will be noted, for example, that supply voltage variations deriving from causes inside or outside of the integrated circuit itself, are directly transferred to the digital timing signals supplied by generators supplied with this voltage.

These signals are generally obtained by a simple short-circuiting of the generator circuit output, for specific time intervals, alternately at the positive and the negative terminal of the supply.

The peak-to-peak amplitude of the timing signals is therefore equal to that of the entire supply voltage, which may lead to variations if no suppression is carried out.

The "noise" of the supply source is then transferred, via these digital timing signals, to the digital or analog sub-systems to which they are supplied, thereby impairing the efficiency of the entire system. This problem must also be taken into account in the construction of switched capacitor circuits (SCC), based on elementary circuit structures comprising one capacitor and two or more switches formed by metal-oxide-semiconductor (MOS) field-effect transistors. One plate of the capacitor is alternately brought to two separate reference potentials, which are opposite to one another with respect to a fixed potential at which the other plate is maintained, by means of switches which are controlled by non-superimposed two-phase timing signals having a pulse waveform of rectangular type.

As is known to persons skilled in the art, these elementary switched capacitor circuit structures are equivalent, as regards their electrical behavior, to a resistance and are particularly suitable for use in the construction of high quality integrated circuit active filters used in transmission systems of PCM (Pulse-Code-Modulation) type.

The use of an equivalent switched capacitor circuit in place of a conventional resistor provides considerable advantages in terms of accurate construction and compact integration and is, moreover, fully compatible with the technologies used for digital integrated circuits.

The use of switched capacitor circuits in monolithically integrated active filters is not only economically advantageous, but also enables these filters to be provided with characteristics which may be better controlled, without the need for subsequent operational calibration.

The advantages set out above would, however, be completely cancelled out if the noise caused by supply voltage variations were transferred to the filter output, by the synchronizing signals for controlling the MOS transistor switches.

The way in which this can happen is shown below with reference to FIG. 1 which takes as its example the known circuit diagram of a switched capacitor differential integrator circuit used as a basic component in the active filters of PCM transmission systems.

The circuit diagram of FIG. 1 shows a capacitor $C_s$, two pairs of MOS field-effect transistors, M11, M12 and M21, M22, and an operational amplifier AL of differential type.

The transistors, all of N-channel or P-channel type, act as switches for switching of the capacitor $C_s$. The gate electrode of the transistor M11 and the gate electrode of the transistor M21 are coupled to a first input terminal C.

The gate electrode of the transistor M12 and the gate electrode of the transistor M22 are coupled to a second input terminal $\overline{C}$.

The two input terminals C and $\overline{C}$ are coupled to the output terminal of a non-superimposed two-phase timing signal generator having a pulse waveform of rectangular type (not shown).

A first terminal of the capacitor $C_s$ is coupled to the earth of the circuit via the transistor M11 and to the inverting input (−) of the amplifier A1 via the transistor M12.

The second terminal of the capacitor $C_s$ is coupled to a first and a second voltage signal input $V_1(t)$ and $V_2(t)$ via the transistor M21 and the transistor M22 respectively. The non-inverting input (+) of the amplifier A1 is coupled to earth. The voltage signal output $V_o(t)$ of the amplifier A1 is coupled, via an integration capacitor CI, to the inverting terminal (−) at a connection point S which acts as a summing node.

It can immediately be seen that when a high signal level is supplied to the gate electrode of the transistor M12 and thus the charge stored in the capacitor $C_s$ is injected, via the transistor M12, if it is of the N-channel type, into the summing node, the possible noise with which the timing signal itself is affected as a result of voltage variations in the supply source of its generator, is transferred to this node via the gate channel stray capacitance $C_{GS}$ of the transistor M12.

The output signal of the operational amplifier A1 is also impaired as a result of this noise.

A variation $\delta V_C$ of the voltage level of the timing signal supplied to the transistor M12 also causes a variation $\delta V_o$ of the level of the output signal $v_o(t)$ expressed by the relationship:

$$\delta V_o = \frac{C_{GS}}{CI} \delta V_C$$

The output signal of a more complex circuit system, for example of an active filter in its entirety, comprising various switched capacitor circuit structures of the above type, is further impaired as a result of the numerous connections which exist, via the timing signals, between the summing nodes at the input of the operational amplifiers and the supply source or sources.

The main paths for these connections are formed by the stray capacitances of the monolithically integrated capacitors, by the stray capacitances of the MOS transistors which act as switches and by the stray capacitances of the connection tracks.

In order to remedy this drawback, solutions mainly of a technological type are known, such as, for example, shielding both the integrated capacitors and the connection tracks with diffusion regions connected to earth and biasing the diffusing regions in which the MOS transistors are provided by stabilized voltages.

In addition, in order to limit the effect of the transconductance between the channel and the substrate in MOS transistors for input to the operational amplifiers, generally comprising N-channel transistors, the source region of each of these transistors may be coupled to the substrate.

A further known solution of the problem of the noise sensitivity to supply sources, used specifically for active filters with high selectivity and operating exclusively at a circuit level, involves the use of the circuit system in a completely differential manner in order to cancel the effect of the noise in the output signal. This solution leads, however, to design restrictions and higher costs for integrated circuit uses.

SUMMARY OF THE INVENTION

It is therefore an object of the present invention to provide a noise suppression interface circuit for non-superimposed two-phase timing signal generators, having a pulse waveform of rectangular type, which is particularly suitable for use in PCM transmission systems.

The aforementioned and other objects are accomplished, according to the present invention, by providing two intermediate voltage terminals for determining the voltage of the timing signals. The intermediate voltage terminals are isolated from the positive and negative power supply terminals by metal-oxide-semiconductor type field effect transistors, operating in a saturation mode and having gate terminals thereof coupled to reference potential voltages. The intermediate terminals are each coupled to the common potential by identical numbers of metal-oxide-semiconductor type field effect transistors connected in a diode configuration and operating in a saturation mode.

These and other features of the present invention will be understood by reading the following description along with the drawings.

DESCRIPTION OF THE PREFERRED EMBODIMENT

Figure 1:
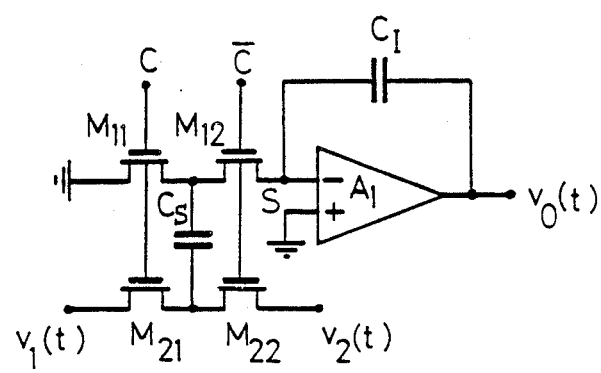
FIG. 1 shows the known circuit diagram, described above, of a switched capacitor differential integrator for active filters.
Figure 2:
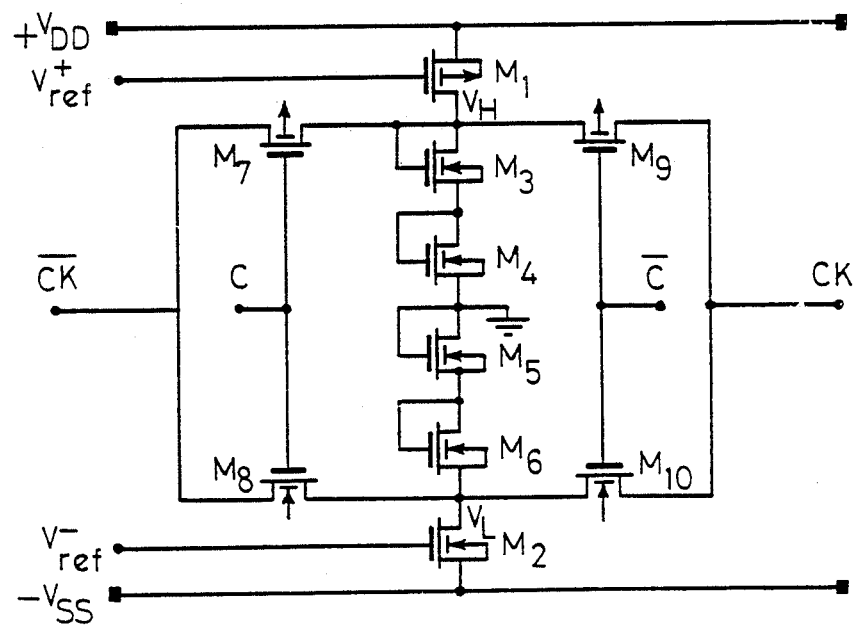
FIG. 2 shows the diagram of a noise suppression interface circuit of the present invention.

The interface circuit of the invention, shown in FIG. 2, can be constructed as a MOS insulated gate, enhancement, field-effect transistor integrated circuit. The interface circuit can form part of a more complex integrated circuit which is not further illustrated.

The interface circuit comprises a first transistor M1 and a second transistor M2, of the P-channel and N-channel types respectively, having their source electrodes connected to the positive pole $+V_{DD}$ and the negative pole $-V_{SS}$ respectively of a supply voltage generator, the potentials of these poles being equal and opposite with respect to the common potential or earth of the circuit, also identified as the "analog earth" and ground potential in the prior art.

The gate electrodes of the transistor M1 and M2 are respectively coupled to a first $V^+_{ref}$ and a second voltage reference $V^-_{ref}$, constituted by circuit means (not shown) which set these electrodes to predetermined potentials with respect to the positive pole $+V_{DD}$ and the negative pole $-V_{SS}$ respectively.

A third, fourth, fifth and sixth transistor M3, M4, M5 and M6, each of which is of the N-channel type and has its gate electrode connected to the drain electrode, are inserted in series by means of their source and drain electrodes between the drain electrode of the transistor M1 and the drain electrode of the transistor M2.

The central connection node between the source electrode of the transistor M4 and the drain electrode of the transistor M5 is coupled to the common potential.

The interface circuit has a first input terminal C and a second input terminal $\overline{C}$ and a first and second output terminal, CK and $\overline{CK}$ respectively.

The first input terminal C is constituted by the coupled point between the gate electrodes of a seventh M7 and the eighth transistor M8, respectively P-channel and N-channel, which drain electrodes are coupled together to form the second output terminal $\overline{CK}$.

The source electrodes of the seventh and eighth transistors, M7 and M8, are respectively coupled to the drain electrode of the first transistor M1, at a circuit node $V_H$, and to the drain electrode of the second transistor M2, at a circuit node $V_L$.

The second input terminal $\overline{C}$ is constituted by the connection point between the gate electrodes of a ninth and tenth transistor M9 and M10, respectively P-channel and N-channel, which drain electrodes are coupled together to form the first output terminal CK.

The source electrodes of the ninth and tenth transistors M9 and M10 are respectively coupled to the drain electrodes of the first transistor M1, at the node $V_H$, and to the drain electrode of the second transistor M2, at the node $V_L$.

The transistors M7, M8, M9 and M10 act exclusively as switches, driven by the timing signals suppled to the input terminals C and $\overline{C}$, in order to transfer alternately to each of the output terminals CK and $\overline{CK}$, the potential levels of the nodes $V_H$ and $V_L$. Timing signals, which are still in two non-superimposed phases and having a pulse waveform of rectangular type, are therefore obtained at the output terminal of the interface circuit shown in FIG. 2. In contrast, however, to the input signals, these output timing signals in practice contain no noise due to the supply source.

In accordance with the invention, the potential difference between the two nodes $V_H$ and $V_L$ is maintained constant by decoupling these nodes electrically from the supply so as to keep their potential largely independent of fluctuations in the supply voltage.

In order to prevent the fluctuations of the potential of the negative pole $-V_{SS}$ of the supply from causing, as a result of a variation of the polarization of the integrated circuit substrate, variations of the threshold voltage of the transistors M3, M4, M5 and M6, which operate at saturation as they are of the enhancement type and have a diode connection, use is made of the technical possibility of shortcircuiting the regions, doped with P-type impurities, in which these transistors are provided, to the source electrodes of the respective transistors.

The total voltage drop across the transistors inserted between the nodes $V_H$ and $V_L$ is therefore kept constant.

The main feature of the invention consists, however, in that the two complementary transistors M1 and M2 are biased such that they always operate at saturation because they also have their respective source electrodes short-circuited to the regions in which these transistors are provided.

For this purpose the voltage references $V^+_{ref}$ and $V^-_{ref}$ and the values of the threshold voltages of the transistors M3, M4, M5 and M6 inserted between the nodes $V_H$ and $V_L$ are selected in a suitable way. Because the gate-source voltages supplied to the transistors M1 and M2 are constant, their drain currents are therefore constant and independent of fluctuations in the supply.

It can be seen from the circuit diagram of FIG. 2, that a variation $\delta V_H$ of the potential of the node $V_H$ corresponds to a variation $\delta V_{DD}$ of the potential of the positive pole $+V_{DD}$ expressed by the following relationship:

$$\delta V_H = \frac{go1}{g_m/2 + go1} \delta V_{DD} = \frac{2go1}{g_m + 2go1} \delta V_{DD}$$

in which $g_m$ is the transconductance of the transistors M3 and M4, assumed to be identical, and go1 is the output conductance of the transistor M1. A similar relationship exists between the variations of the potential of the negative pole $-V_{SS}$ and the consequent potential variations of the node $V_L$. In order to minimize $\delta V_H$ it is necessary to make the ratio go1/$g_m$ as small as possible.

Because in a field-effect transistor operating at saturation the transconductance, for a specific bias current, has a value which is much greater than that of the output conductance, in order of minimize the potential variation $\delta V_H$ of the node $V_H$ due to the supply noise, the transistor M1 is kept in the saturation zone of its field of operation. Similarly, the transistor M2 is also caused to operate at saturation.

This solution to the problem of noise in the supply source can then be optimized by taking suitable technical steps, on the basis of known teaching, for example, by making M1 and M2 transistors having particularly long channels so as to reduce the go1/gm ratio as much as possible.

In an interface circuit of the invention it is possible in practice to obtain a drastic noise reduction (~46 dB) at the cost of a reduction of the dynamic range of the signal which is of no importance at all for the requirements of normal applications.

The maximum output signal voltage available when the transistors M1 and M2 are operating at saturation is given by:

$$(V_H - V_L)_{MAX} = V^+_{ref} - V^-_{ref} - (V_{Tn} + |V_{Rp}|)$$

in which $V_{Tn}$ and $V_{Tp}$ respectively stand for the threshold voltages of the complementary transistors M2 and M1.

By selecting the reference voltage for $V^+_{ref}$ and $V^-_{ref}$ such that the transistors M1 and M2 are only biased by a few hundred mVolts above the threshold voltage, the dynamic range of the output synchronization signals is also close to the supply voltage between $+V_{DD}$ and $-V_{SS}$.

In order to provide an optimum dynamic range for the output pulse signals, a greater number of diode-connected transistors may, for example, be inserted between the nodes $V_H$ and $V_L$, while maintaining a symmetrical configuration with respect to the central connection node connected to earth.

The foregoing description is included to illustrate the operation of the preferred embodiment and is not meant to limit the scope of the invention. The scope of the invention is to be limited only by the following claims. Many variations will be apparent to one skilled in the art that would yet be encompassed by the spirit and scope of the invention.

What is claimed is:

1. A noise suppression interface circuit for non-superimposed two-phase timing signal generators, having a pulse waveform of rectangular type, having a first (C) and a second ($\overline{C}$) input terminal for connection to a timing signal generator and a first (CK) and a second ($\overline{CK}$) output terminal for connection to a user circuit, characterized in that the circuit comprises first (M1) and second (M2) field-effect transistors having their source electrodes connected respectively to first ($+V_{DD}$) and second ($-V_{SS}$) supply terminals and having their gate electrodes connected respectively to first ($V^+_{ref}$) and second ($V^-_{ref}$) and second ($V^-_{ref}$) voltage references which respectively maintain the gate electrode of the first transistor (M1) at a constant potential with respect to the potential of the first supply terminal ($+V_{DD}$) and the gate electrode of the second transistor (M2) at a constant potential with respect to the potential of the second supply terminal ($-V_{SS}$), and in that the circuit comprises a constant potential circuit node (earth) intermediate between the potentials of the first ($+V_{DD}$) and the second ($-V_{SS}$) supply terminals from which it differs by an equal amount, at least two field effect transistors (M3, M4) being inserted via their source and drain electrodes between the constant potential node and the drain electrode of the first transistor (M1), and in that between the constant potential node and the drain electrode of the second transistor (M2) there are inserted, via their source and drain electrodes, a number of transistors (M4, M5) equal to the number of transistors (M3, M4) inserted between the drain electrode of the first transistor (M1) and the constant potential node itself, the transistors (M3, M4) between the constant potential node and the drain electrode of the first transistor (M1) and the transistors (M5, M6) between the constant potential node and the drain electrode of the second transistor (M2) having their gate electrodes connected to their drain electrodes, the drain electrodes of the first (M1) and the second (M2) transistors both being coupled to the second output terminal ($\overline{CK}$) via a first (M7) and a second (M8) field-effect transfer transistor respectively, which gate electrodes are both coupled to the first input terminal (C), the drain electrodes of the first (M1) and the second (M2) transistors also both being coupled to the first output terminal (CK) via a third (M9) and a fourth (M10) field-effect transfer transistor respectively, gate electrodes of said third (M9) and said fourth (M10) field effect transistors both being coupled to the second input terminal (C̄), and characterized in that these first (M1) and second (M2) transistors are biased such that they operate in the saturation zone of their field of operation.

2. An interface circuit as claimed in claim 1, characterized in that the first field-effect transistor (M1) and the first (M7) and third (M9) field-effect transfer transistors are of P-channel type and in that all other transistor contained therein are of N-channel type.

3. An interface circuit as claimed in claim 2, characterized in that all the transistors contained therein are MOS insulated-gate, enhancement, field-effect transistors.

4. A circuit adapted for connection to a non-superimposed two-phase timing signal generator for providing a timing signal at output terminals, comprising:
   a first MOS field effect transistor having a source terminal coupled to a positive supply terminal;
   a second MOS field effect transistor having a source electrode coupled to a negative supply terminal;
   a positive and negative reference voltage coupled respectively to gate terminals of said first and said second field effect transistors, said first and second field effect transistors being operated in saturation, wherein a drain terminal of said first transistor and a drain terminal of said second transistor are connected to a first and second intermediate supply terminals for said signal generator; and
   means (comprising MOS field effect transistors M3–M10) for coupling said first and second intermediate supply terminals to said output terminals in response to a signal at input terminals from said timing generator, said means having a common terminal which is connected to a common ground potential of a positive and negative supply supplying said positive and negative supply terminals.

5. The circuit of claim 4 wherein said means for coupling includes:
   a plurality of third MOS field effect transistors coupled between said common terminal and said first transistor drain terminal, said plurality of third transistors connected in a diode configuration; and
   a plurality of fourth MOS field effect transistors coupled between said common terminal and said second transistor drain terminal, said plurality of fourth transistors are all connected in a diode configuration.

6. The circuit of claim 5 wherein said first MOS field effect transistor is a p-channel transistor, and wherein said second, said plurality of third and said plurality of fourth MOS field effect transistors are n-channel transistors.

7. The circuit of claim 6 wherein said means for coupling further includes a fifth and a sixth MOS field effect transistor coupling said first transistor drain terminal and said second transistor drain terminal to a first output terminal, respectively, wherein gate terminals of said fifth and said sixth transistor are coupled to a first input terminal, said circuit further including a seventh and eighth MOS field effect transistor coupling said first transistor drain terminal and said second transistor drain terminal respectively to a second output terminal, wherein said gate terminals of said seventh and eighth transistor are coupled to a second input terminal.

8. An interface circuit adapted for connection to a timing signal generator for providing timing signals with reduced noise at first and second output terminals, comprising:
   a voltage supply having a positive and a negative terminal and a common ground potential;
   a first intermediate terminal and a second intermediate terminal;
   first transistor means coupled between said positive terminal and said first intermediate terminal for attenuating voltage supply fluctuations at said first intermediate terminal;
   second transistor means coupled between said negative terminal and said second intermediate terminal for attenuating voltage supply fluctuation at said second intermediate terminal;
   third transistor means (comprising MOS field effect transistors M3 and M4) coupled between said first intermediate terminal and a common terminal, said common terminal being connected to said common ground potential;
   fourth transistor means (comprising MOS field effect transistors M5 and M6) coupled between said second intermediate terminal and said common terminal; and
   fifth transistor means (comprising MOS field effect transistors M7–M10) for coupling said first intermediate terminal and said second intermediate terminal to said first and second output terminals, respectively, in response to a signal provided by said generator.

9. The circuit of claim 8 wherein said first and third transistor means are operated in a region such that a ratio of output conductance of said first transistor means to transconductance of said third transistor means is minimized.

10. The circuit of claim 8 wherein said first and second transistor means have a first and second reference voltage coupled to gate terminals thereof.

11. The circuit of claim 10 wherein said transistor means are comprised of metal-oxide-semiconductor insulated gate, enhancement field effect transistors.

12. The circuit of claim 11 wherein said first transistor means is a p-channel device and said second, third and fourth transistor means are n-channel devices.

13. The circuit of claim 12 wherein said fifth transistor means is comprised of a p-channel device coupled to said first intermediate terminal and an n-channel device coupled to said second intermediate terminal.

* * * * *